(12) United States Patent
Kitajima

(10) Patent No.: US 7,847,370 B2
(45) Date of Patent: Dec. 7, 2010

(54) SEMICONDUCTOR DEVICE WITH RESISTOR AND FUSE AND METHOD OF MANUFACTURING THE SAME

(75) Inventor: Yuichiro Kitajima, Chiba (JP)

(73) Assignee: Seiko Instruments Inc., Chiba-shi, Chiba (JP)

( * ) Notice: Subject to any disclaimer, the term of this patent is extended or adjusted under 35 U.S.C. 154(b) by 107 days.

(21) Appl. No.: 12/027,620

(22) Filed: Feb. 7, 2008

(65) Prior Publication Data

US 2008/0185678 A1 Aug. 7, 2008

(30) Foreign Application Priority Data

Feb. 7, 2007 (JP) .............................. 2007-028297

(51) Int. Cl.
*H01L 29/00* (2006.01)
(52) U.S. Cl. ............................... 257/529; 257/E23.149
(58) Field of Classification Search ................ 257/209, 257/358, 259, 380, 516, 529, 530, E21.004, 257/E21.592, E23.147, E23.149; 438/131, 438/132, 215, 281, 333, 382, 467, 600, 601
See application file for complete search history.

(56) References Cited

U.S. PATENT DOCUMENTS

2001/0004549 A1* 6/2001 Arndt et al. ................. 438/601

FOREIGN PATENT DOCUMENTS

JP 9-246384 A 9/1997

* cited by examiner

*Primary Examiner*—Steven Loke
*Assistant Examiner*—Suberr Chi
(74) *Attorney, Agent, or Firm*—Brinks Hofer Gilson & Lione

(57) ABSTRACT

A fuse element is laminated on a resistor and the resistor is formed in a concave shape below a region in which cutting of the fuse element is carried out with a laser. Accordingly, there can be provided a semiconductor device which occupies a small area, causes no damage on the resistor in the cutting of the fuse element, has a small contact resistance occurred between elements, and has stable characteristics, and a method of manufacturing the same.

3 Claims, 6 Drawing Sheets

Prior Art

SEMICONDUCTOR DEVICE WITH RESISTOR AND FUSE AND METHOD OF MANUFACTURING THE SAME

This application claims priority under 35 U.S.C. §119 to Japanese Patent application No. JP2007-028297 filed Feb. 7, 2007, the entire content of which is hereby incorporated by reference.

TECHNICAL FIELD

The present invention relates to a semiconductor device in which a resistor and a fuse element are connected in parallel and a resistance value can be adjusted by cutting the fuse element, a semiconductor device having a bleeder resistance circuit which can, by cutting fuse elements which are connected in parallel with two or more resistors, respectively, adjust voltage output divided by the resistors, and a method of manufacturing the same.

BACKGROUND ART

When the resistor and the fuse element are formed in the same layer in a semiconductor device in which a resistor formed of a polycrystalline silicon film and a fuse element are electrically connected in parallel, two elements have to be arranged in the same plane, causing an increase in chip area. One way to solve this problem is illustrated in FIG. 9, where increase in area is suppressed by laminating a second polycrystalline silicon film 302 on a first polycrystalline silicon film 301 via a first oxide film 202 (see, for example, Japanese Patent Laid-open Application No. JP09-246384A).

When a resistor and a fuse element are laminated in the conventional manufacturing method described in JP09-246384A, the first oxide film 202 should be thick enough for fear that cutting of the fuse element by laser may damage the resistor. A thick first oxide film 202 increases the aspect ratio at the connection between the first polycrystalline silicon film 301 and the second polycrystalline silicon film 302, making the formation of connection difficult. Though electrical connection between the first polycrystalline silicon film 301 and the second polycrystalline silicon film 302 is made through their mutual contact, there is a problem in that, when native oxide film is not sufficiently removed before the deposition of the second polycrystalline silicon film 302, satisfactory electrical connection cannot be obtained.

SUMMARY OF THE INVENTION

In order to solve the above-mentioned problems, the present invention employs the following means:

(1) a semiconductor device, including:
a semiconductor substrate having a main surface;
a concave portion formed in the main surface of the semiconductor substrate;
an insulating layer covering an inner surface of the concave portion and the main surface of the semiconductor substrate;
a resistor formed on the insulating layer so as to extend from within the concave portion onto the main surface of the semiconductor substrate;
a first oxide film embedded in the concave portion so as to be flush with the main surface of the semiconductor substrate;
a fuse element formed on the first oxide film so as to overlie the resistor;
a second oxide film formed so as to cover the fuse element, the first oxide film, and the resistor; and
a interconnect layer formed on the second oxide film to be electrically connected with the resistor and the fuse element via a plug;

(2) a semiconductor device, in which the resistor is formed of a first polycrystalline silicon film;

(3) a semiconductor device, in which the resistor is formed of a second polycrystalline silicon film;

(4) a method of manufacturing a semiconductor device having resistors and fuse elements and including a bleeder resistance circuit which can, by cutting one of the fuse elements connected in parallel with one of the resistors, adjust voltage output divided by the resistors, including the steps of:
forming a trench in a semiconductor substrate;
forming a field insulating film on the semiconductor substrate having the trench formed therein;
forming a first polycrystalline silicon film on the field insulating film;
introducing an impurity into the first polycrystalline silicon film;
patterning the first polycrystalline silicon film;
depositing and planarizing using an etch-back method a first oxide film and an SOG film;
forming a second polycrystalline silicon film;
introducing an impurity into the second polycrystalline silicon film;
patterning the second polycrystalline silicon film;
forming an interlayer film on the second polycrystalline silicon film;
forming a plug in a region where the first polycrystalline silicon film and the second polycrystalline silicon film are laminated;
forming thereon a conductor as a interconnect layer;
forming thereon a passivation film;
forming thereon a polyimide film; and
patterning the passivation film and the polyimide film;

(5) a method of manufacturing a semiconductor device, in which the step of forming a first polycrystalline silicon film includes forming the first polycrystalline silicon film at a thickness ranging from 100 nm to 400 nm;

(6) a method of manufacturing a semiconductor device, in which the step of forming a second polycrystalline silicon film includes forming the second polycrystalline silicon film at a thickness ranging from 200 nm to 400 nm;

(7) a method of manufacturing a semiconductor device, in which the step of an impurity into the first polycrystalline silicon film includes introducing the impurity into the first polycrystalline silicon film with a dose ranging from $1\times10^{14}/cm^2$ to $5\times10^{15}/cm^2$;

(8) a method of manufacturing a semiconductor device, in which the step of introducing an impurity into the second polycrystalline silicon film includes introducing the impurity into the second polycrystalline silicon film with a dose of at least $5\times10^{15}/cm^2$;

(9) a method of manufacturing a semiconductor device, in which the step of forming a trench in a semiconductor substrate includes forming the trench to a depth of 500 nm to 2,000;

(10) a method of manufacturing a semiconductor device, in which the step of forming a first oxide film includes forming the first oxide film at a thickness approximately equal to or larger than the depth to which the trench is formed; and

(11) a semiconductor device including: at least two resistors, each of the at least two resistors being connected in parallel with a fuse element; and a bleeder resistance circuit which can, by cutting the fuse element, adjust voltage output divided by the at least two resistors, in which each of the at least two resistors and the fuse element are connected in parallel to form the semiconductor device according to the present invention.

Lamination of a resistor and a fuse element permits formation of a semiconductor device having the resistor and the fuse element connected in parallel and a smaller area compared to a conventional semiconductor device. By applying the semiconductor device according to the present invention to a bleeder resistance circuit, which is formed of two or more resistors each connected in parallel with a fuse element and capable of adjusting voltage output divided by the resistors by cutting a fuse element, beneficial effect can be obtained in making the area smaller.

Further, because a thick oxide film is formed between the resistor and the fuse element in a concave shape formed on a semiconductor substrate, damage to the resistor can be eliminated.

Further, because the resistor, the fuse element, and metal interconnect are electrically connected via a plug, contact resistance at each junction can be decreased.

As described above, there can be provided a semiconductor device having a resistor, which occupies a small area and has stable characteristics, and a fuse element connected in parallel.

DETAILED DESCRIPTION OF THE PREFERRED EMBODIMENTS

Hereinafter, a preferred embodiment of a semiconductor device according to the present invention will be described in detail with reference to the attached drawings.

Figure 1:
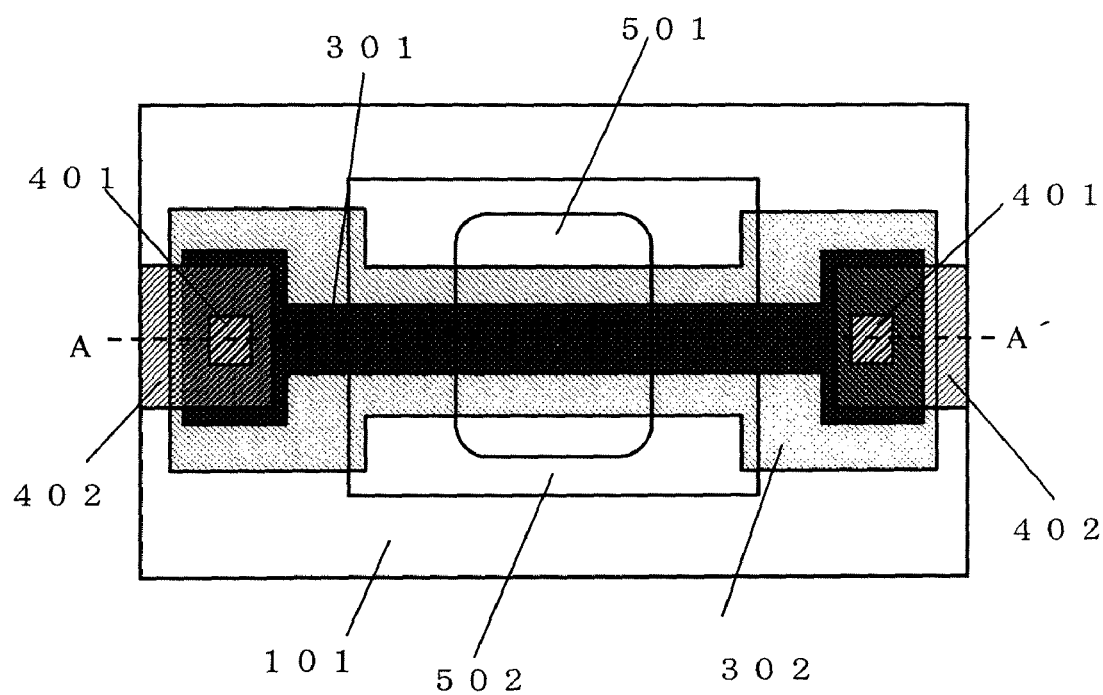
FIG. 1 shows a schematic plan view illustrating a semiconductor device according to the present invention.
Figure 2:
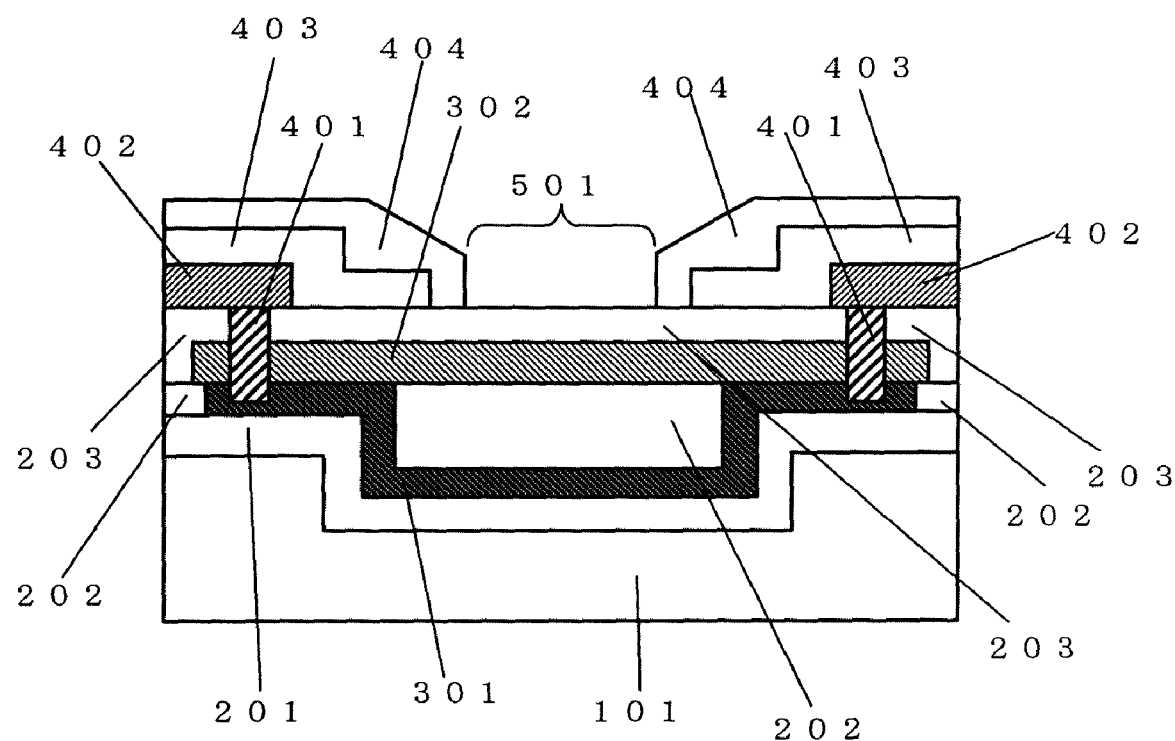
FIG. 2 shows a schematic sectional view illustrating the semiconductor device according to the present invention.

FIG. 1 is an example of a plan view of a semiconductor device according to an embodiment of the present invention. FIG. 2 is an exemplary sectional view taken along the line A-A' of FIG. 1 of the semiconductor device according to the embodiment of the present invention.

As illustrated in FIG. 1, a resistor formed of a first polycrystalline silicon film 301 is formed on a trench region 502. Laminated to the resistor, a fuse element formed of a second polycrystalline silicon film 302 is formed. The resistor, the fuse element, and metal interconnect 402 are electrically connected via a plug 401. A region 501 for cutting the fuse element is formed at the center of the fuse element where the fuse element is to be cut later with a laser.

As illustrated in FIG. 2, the resistor formed of the first polycrystalline silicon film 301 is formed so as to be in a concave shape on a field insulating film 201 along a shape of a semiconductor substrate 101 where the trench region 502 is formed. The fuse element formed of the second polycrystalline silicon film 302 is laminated on the first polycrystalline silicon film 301 which is planarized by a first oxide film 202.

By forming the resistor formed of the first polycrystalline silicon film 301 in the concave shape and then planarizing the resistor, the first oxide film 202 to be located later below the region 501 for cutting the fuse element becomes thick, and thus, the first oxide film 202 functions as a protective film when the fuse element is cut, and there is no fear that the resistor may be damaged when the fuse element is cut. A second oxide film 203 as an interlayer film is formed on the fuse element formed of the second polycrystalline silicon film 302, and the metal interconnect 402 is formed thereon for connection with other elements formed on the same semiconductor substrate. The plug 401 is formed so as to pierce the second oxide film 203 and the second polycrystalline silicon film 302 to electrically connect the first polycrystalline silicon film 301, the second polycrystalline silicon film 302, and the metal interconnect 402. The electrical connection via the plug 401 can decrease contact resistance between the layers. A passivation film 403 and a polyimide film 404 are formed above the metal interconnect 402 so as to leave the region 501 for cutting the fuse element uncovered.

Next, a preferred embodiment of a method of manufacturing the semiconductor device according to the present invention will be described in detail with reference to the drawings.

Figure 3:
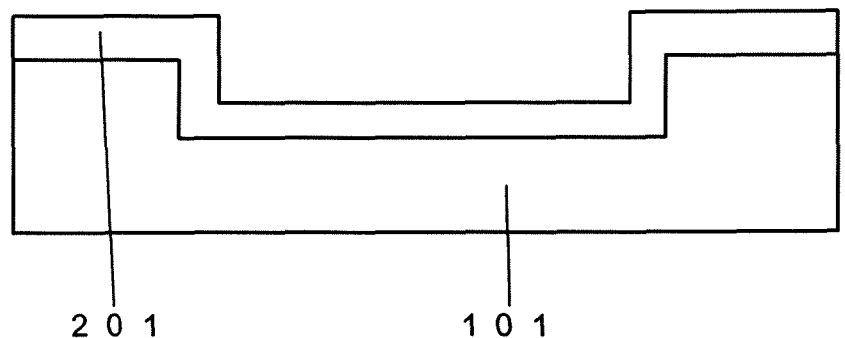
FIG. 3 shows a schematic sectional view of a process step in a sequence of a method of manufacturing the semiconductor device according to the present invention.

FIG. 3 is a sectional view of the semiconductor device after a trench is formed in the semiconductor substrate 101 and then the field insulating film 201 as an interlayer film is formed. The depth of the trench affects the thickness of the interlayer film between the resistor and the fuse element in the region for cutting the fuse element to be formed later. When the depth of the trench is small, the function as the protective film when the fuse element is cut is insufficient. When the depth of the trench is large, it is difficult to embed the oxide film. Therefore, the depth of the trench formed in the semiconductor substrate 101 is in a range of about 500 nm to 2,000 nm. After that, the field insulating film 201 is formed on the semiconductor substrate 101 having the trench formed therein.

Figure 4:
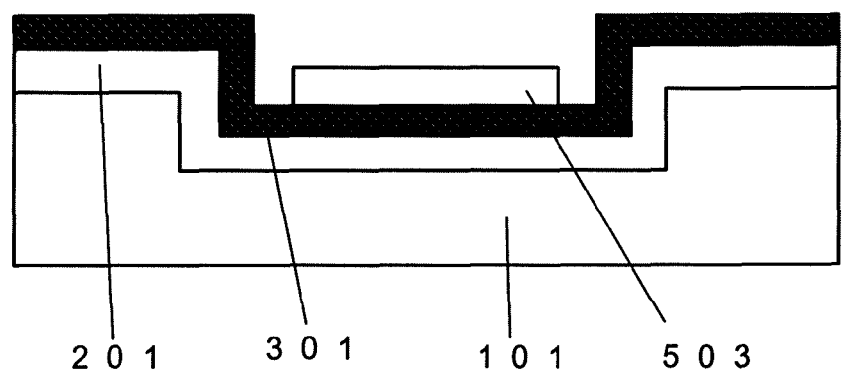
FIG. 4 shows a schematic sectional view of a process step in the sequence of the method of manufacturing the semiconductor device according to the present invention.

Then, as illustrated in FIG. 4, the first polycrystalline silicon film 301 to be the resistor is deposited at a thickness of about 100 nm to 400 nm using CVD, for example. Here, when the first polycrystalline silicon film 301 is used as other elements on the same semiconductor substrate, such as a gate electrode of a transistor or interconnect, the thickness may be relatively large ranging from about 200 nm to 400 nm, and, when the first polycrystalline silicon is used only as the resistor, the thickness may be in a range of about 100 nm to 200 nm. After that, an impurity is implanted into the first polycrystalline silicon film 301 by ion implantation. As the impurity, when the resistor is of an n type, arsenic, phosphorus, or the like is used, while, when the resistor is of a p type, boron, BF2, or the like is used. The dose of the ion implantation is in a range of $1 \times 10^{14}/cm^2$ to $5 \times 10^{15}/cm^2$. Here, when a high resistance resistor is to be formed, light doping to a resistance region and heavy doping to electrode lead-out regions are necessary, and thus, introduction of the impurities are divided in two steps.

First, an impurity of $1\times10^{14}/\text{cm}^2$ to $5\times10^{14}/\text{cm}^2$ is implanted into the whole first polycrystalline silicon film 301. After that, a photoresist 503 is patterned by photolithography such that the electrode lead-out region to be connected later with the second polycrystalline silicon film 302 and the metal interconnect 402 via the plug 401 is left uncovered. After that, with the photoresist 503 being used as a mask, an impurity of about $5\times10^{15}/\text{cm}^2$ is implanted and the photoresist is removed.

Then, a photoresist is patterned by photolithography such that portions other than a predetermined region are left uncovered. By patterning the first polycrystalline silicon film 301 with the photoresist being used as a mask and removing the photoresist thereafter, the resistor having the resistance region and the electrode lead-out region is formed.

Figure 5:
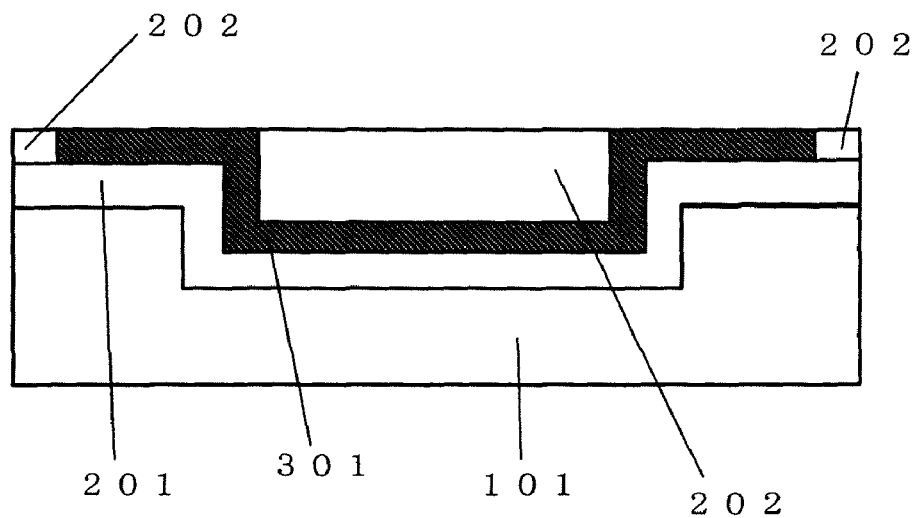
FIG. 5 shows a schematic sectional view of a process step in the sequence of the method of manufacturing the semiconductor device according to the present invention.

After that, in order to use the etch-back method, the first oxide film 202 based on TEOS is deposited by CVD, for example, at a thickness similar to or larger than the depth of the trench. Further, an SOG film is applied onto the first oxide film 202. Then, etching is carried out to a surface of the first polycrystalline silicon film 301. FIG. 5 illustrates a state where the surface is planarized by the etch-back method. The oxide film 202 remains in a concave portion and the surface of the semiconductor substrate is planarized. It is to be noted that, here, any remain of thin oxide film on the surface of the first polycrystalline silicon film 301 causes no effect. This is because electrical connection is ultimately made via the plug 401, and thus, little consideration is needed for contact resistance in connecting the first polycrystalline silicon film 301 with the subsequently deposited second polycrystalline silicon film 302.

Figure 6:
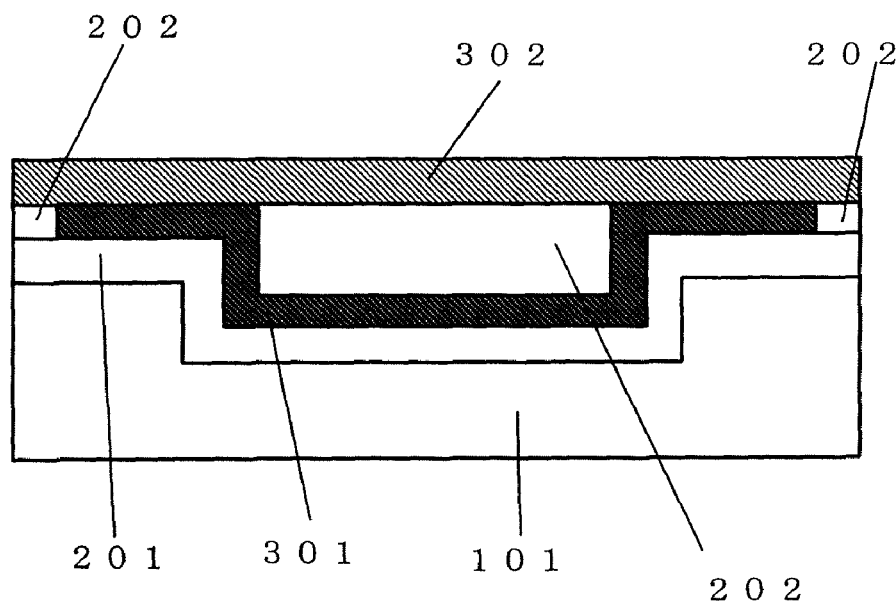
FIG. 6 shows a schematic sectional view of a process step in the sequence of the method of manufacturing the semiconductor device according to the present invention.

Then, as illustrated in FIG. 6, the second polycrystalline silicon film 302 as the fuse element is deposited by CVD, and an impurity is introduced by ion implantation. The thickness of the deposited second polycrystalline silicon film 302 is about 400 nm. As the impurity, when the resistor is of an n type, arsenic, phosphorus, or the like is used, while, when the resistor is of a p type, boron, BF2, or the like is used. The dose of the impurity is $5\times10^{15}/\text{cm}^2$ or more. Because the thickness of the second polycrystalline silicon film 302 is relatively large and the resistance is low, the second polycrystalline silicon film 302 may also be used in other regions on the semiconductor substrate as, for example, a gate electrode of a transistor or interconnect. In the above embodiment, the fuse element is a polycrystalline silicon film, but a polycide formed of polysilicon and a silicide may also be used. Further, the impurity may also be introduced into the second polycrystalline silicon film 302 by solid state diffusion.

Figure 7:
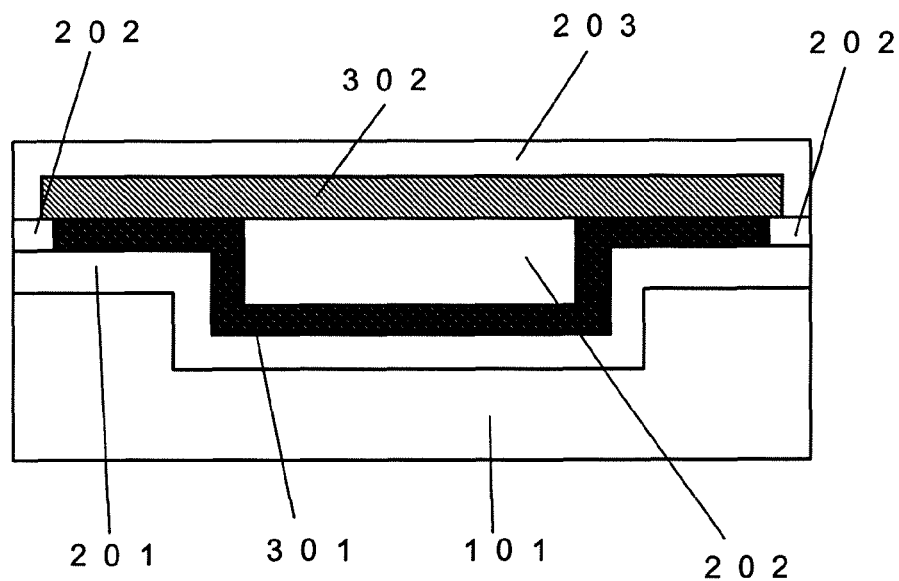
FIG. 7 shows a schematic sectional view of a process step in the sequence of the method of manufacturing the semiconductor device according to the present invention.

Then, the photoresist is patterned on the second polycrystalline silicon film 302 by photolithography such that portions other than the region to be the fuse element are left uncovered. The second polycrystalline silicon film 302 is etched with the photoresist being used as a mask. After that, the second oxide film 203 as an interlayer film is deposited to obtain a shape illustrated in FIG. 7.

Figure 8:
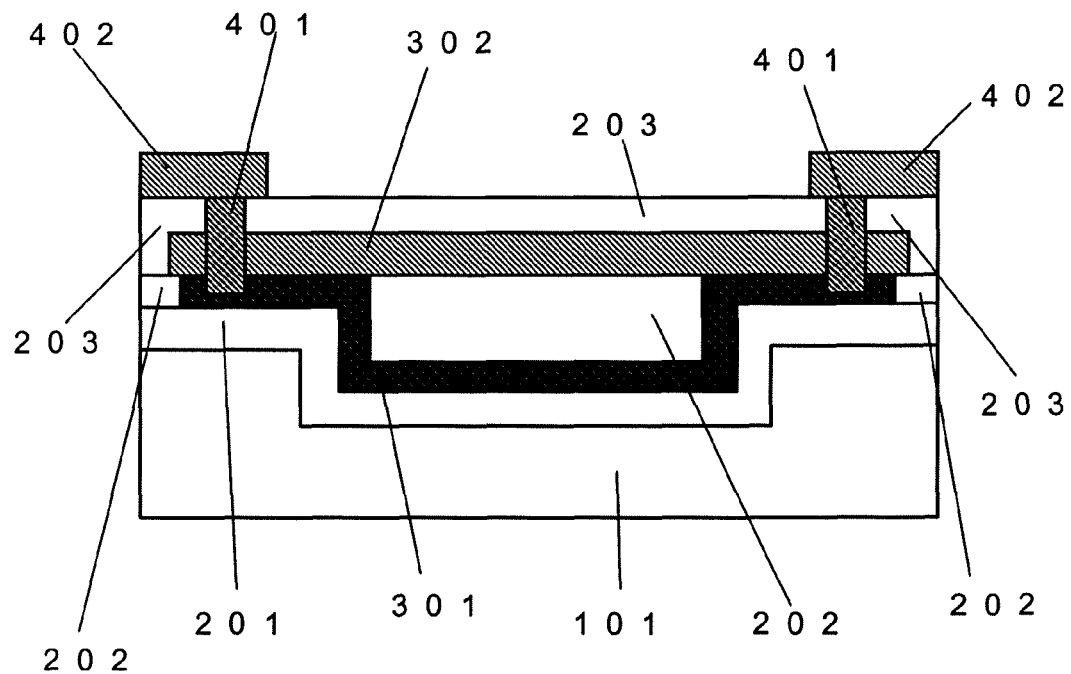
FIG. 8 shows a schematic sectional view of a process step in the sequence of the method of manufacturing the semiconductor device according to the present invention.
Figure 9:
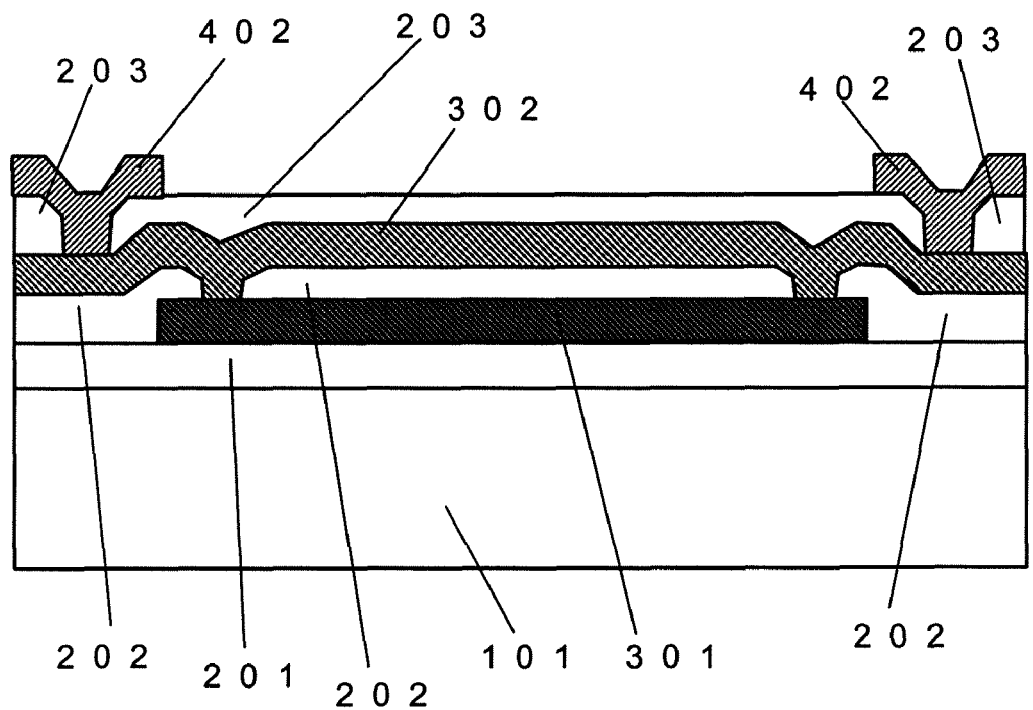
FIG. 9 shows a schematic sectional view of a conventional semiconductor device.

Next, the plug 401 is formed in an electrode region of the resistor formed of the first polycrystalline silicon film 301 and the fuse element formed of the second polycrystalline silicon film 302. The plug 401 is formed so as to pierce the second oxide film 203 and the second polycrystalline silicon film 302 and reach the first polycrystalline silicon film 301. After that, a film as the metal interconnect 402, for example, a metal film containing aluminum or copper is formed by sputtering, and etching is carried out by photolithography with a photoresist being used as a mask, the photoresist being patterned so as to leave a region to be the metal interconnect 402 uncovered to obtain a shape illustrated in FIG. 8. As a result, the first polycrystalline silicon film 301, the second polycrystalline silicon film 302, and the metal interconnect 402 are electrically connected by the plug 401. As the metal film, a lamination containing a barrier metal layer such as Ti/Al—Si—Cu/TiN, an anti-reflection film, or an alloy film containing aluminum, silicon, copper, and the like may be used.

After that, the passivation film 403 such as an SiN film is deposited, and, as an ultimate protective film, a photosensitive polyimide film 404 is applied thereon. Then, by etching the passivation film 403 and the polyimide film 404 so as to expose the region 501 for cutting the fuse element, the shape in section as illustrated in FIG. 2 is obtained. Here, the shape in section as illustrated in FIG. 2 may also be obtained by depositing the passivation film 403, exposing the region 501 for cutting the fuse element, applying the polyimide film 404, and then exposing the region 501 for cutting the fuse element.

In the above embodiment, interconnect is a single layer, but even if the interconnect is multilayer interconnect, by optimizing the thickness of the interlayer on the region for cutting the fuse element, the present invention can be made applicable.

As described above, according to the present invention, there can be formed, by laminating a resistor and a fuse element, a semiconductor device where a resistor and a fuse element are connected in parallel and which occupies a smaller area compared to a conventional semiconductor device. By applying the semiconductor device according to the present invention to a bleeder resistance circuit which is formed of two or more resistors each connected in parallel with a fuse element and capable of adjusting, by cutting a fuse element, voltage output divided by the resistors, there can be obtained a greater effect of making the area smaller.

Further, when the resistor and the fuse element are laminated, damage to the underlying film caused by fuse element cutting may affect the resistor, but a thick oxide film is formed between the resistor and the fuse element in a concave shape formed on a semiconductor substrate, damage to the resistor can be eliminated. Further, because the resistor, the fuse element, and the metal interconnect are electrically connected via a plug, contact resistance at each junction can be decreased.

As described above, there can be provided a semiconductor device where a resistor and a fuse element are connected in parallel, which occupies a small area, and stable characteristics.

The invention claimed is:
1. A semiconductor device, comprising:
a semiconductor substrate having a main surface;
a trench region formed in the main surface of the semiconductor substrate;
an insulating layer covering an inner surface of the trench region and the main surface of the semiconductor substrate;
a resistor formed on the insulating layer so as to extend from within the trench region onto the main surface of the semiconductor substrate;
a first oxide film embedded in the trench region so as to be flush with an upper surface of the resistor;
a fuse element formed on the first oxide film so as to overlie the resistor;
a second oxide film formed so as to cover the fuse element, the first oxide film, and the resistor; and an interconnect layer formed on the second oxide film to be electrically connected with the resistor and the fuse element via a plug.

2. A semiconductor device according to Claim 1, wherein the resistor is formed of a first polycrystalline silicon film.

3. A semiconductor device according to Claim 1, wherein the fuse element is formed of a second polycrystalline silicon film.

* * * * *